(12) United States Patent
Faulkner

(10) Patent No.: US 7,168,989 B2
(45) Date of Patent: Jan. 30, 2007

(54) MODULE FOR THE ASSEMBLY OF TWO SETS OF CONNECTIONS

(75) Inventor: Neil Faulkner, Courtomer (FR)

(73) Assignee: Souriau, Versailles (FR)

( * ) Notice: Subject to any disclaimer, the term of this patent is extended or adjusted under 35 U.S.C. 154(b) by 0 days.

(21) Appl. No.: 11/333,795

(22) Filed: Jan. 17, 2006

(65) Prior Publication Data

US 2006/0172601 A1 Aug. 3, 2006

(30) Foreign Application Priority Data

Feb. 3, 2005 (FR) .................................... 05 01075

(51) Int. Cl.
*H01R 13/66* (2006.01)
(52) U.S. Cl. ................. 439/620.22; 439/655; 439/76.1
(58) Field of Classification Search ............... 439/76.1, 439/655, 620, 638, 650, 651, 622
See application file for complete search history.

(56) References Cited

U.S. PATENT DOCUMENTS

| | | | |
|---|---|---|---|
| 4,482,937 A * | 11/1984 | Berg ........................... 361/789 |
| 4,618,196 A * | 10/1986 | Muzslay ...................... 439/492 |
| 4,697,863 A * | 10/1987 | Galloway et al. ........... 439/544 |
| 4,857,002 A * | 8/1989 | Jensen et al. ............... 439/76.1 |
| 4,954,089 A * | 9/1990 | Jensen et al. ............... 439/76.1 |
| 5,227,955 A * | 7/1993 | Le Bris et al. .............. 361/743 |
| 5,257,949 A * | 11/1993 | Paulus ...................... 439/620.1 |
| 5,290,191 A * | 3/1994 | Foreman et al. ............. 439/225 |
| 5,409,398 A * | 4/1995 | Chadbourne et al. ........ 439/490 |
| 5,573,409 A * | 11/1996 | Shiley et al. ............... 439/76.1 |
| 5,622,506 A * | 4/1997 | Hornig et al. ................. 439/74 |
| 6,089,874 A * | 7/2000 | Kroulik et al. ............... 439/11 |
| 6,386,913 B1 * | 5/2002 | Mohammad et al. ........ 439/579 |

FOREIGN PATENT DOCUMENTS

FR 2 825 196 5/2001
WO WO 01/11727 A1 2/2001

* cited by examiner

*Primary Examiner*—Neil Abrams
*Assistant Examiner*—Harshad C Patel
(74) *Attorney, Agent, or Firm*—Perman & Green, LLP

(57) ABSTRACT

A module for the assembly of two sets of connections, which have on their respective coupling faces a set of contacts whose contacts are distributed according to different layouts and densities, the module comprising a first set of contacts connected to a first printed circuit board, a second set of contacts connected to a second printed circuit board, wherein a central core arranged between the first and the second printed circuit board is provided with cutouts for the positioning and holding in place of conductors in order to provide electrical continuity between the contacts of the first and second set of contacts.

17 Claims, 3 Drawing Sheets

MODULE FOR THE ASSEMBLY OF TWO SETS OF CONNECTIONS

CROSS-REFERENCE TO RELATED APPLICATIONS

This application claims priority from French Patent Application No. 0501075, filed on Feb. 3, 2005.

The present invention relates to a module for the assembly of two sets of connections. It has a particular application in the assembly of two connectors, which have on their respective coupling faces a set of contacts distributed according to different layouts and densities.

Adaptation devices between the connectors which are to be coupled, although they have different layouts of contacts, which equip them, have formed the subject of numerous posties, taking into account the fact that the configuration, the density and the dimensions of the contacts do not systematically form the subject of standards and that the criteria of design of the layout of these contacts are determined by the end-customer.

It is thus that the patent application WO 01/11727 A1 discloses an embodiment of an adapter used as the interface between two connectors comprising different layouts of contacts. According to the said application, two printed circuits receive on one of their respective faces one of the layouts of contacts corresponding to the distribution of the contacts, which equip one of the connectors to be assembled. The faces, which are not equipped with contacts, are fitted opposite one another and comprise metal tracks which provide a link connection between one of the contacts or a group of contacts to one of the plated through holes located on the periphery of each of the printed circuits. An elastic insulating disc is placed between the printed faces of the two circuits, which improves the resistance of the adapter to shock and to vibration. Lastly, pins are inserted into the plated through holes, providing an electrical connection between the metal tracks of the contacts in question.

According to the French patent FR-A-2 825 196, an adapter used as an interface between two connectors comprising different layouts of contacts is also created using two printed circuits each with a specific layout of contacts and metal tracks. According to one embodiment, an insulator is placed between the two printed circuits and comprises a channel, which makes possible the passing of a connection between the conductive posts of the printed circuits. This embodiment however involves the conductive posts of each circuit being arranged opposite one another.

All embodiments described in the prior art use connections of contact posts of a printed circuit located either in a straight line of each other and only concern a very limited number of configurations, or in the periphery of the circuits and therefore only offer complicated solutions when the printed circuit metal tracks are specified. Moreover, none of these embodiments envisages the case of hybrid connectors, in which are laid out not only contacts allocated to the transmission of the signal, but also power contacts, which transmit currents of intensity higher than that accepted by the plated track of a printed circuit.

There is accordingly a need to specify a module for adapters able to remedy the aforementioned problems.

This is why the present invention concerns a module for the assembly of two sets of connections, which have on their respective coupling faces a set of contacts, whose contacts are distributed according to different layouts and densities, the module comprising a first set of contacts connected to a first printed circuit board, a second set of contacts connected to a second printed circuit board, in which a central core arranged between the first and second printed circuit boards is provided with cutouts for the positioning and holding in place of conductors to provide electrical continuity between the contacts of the first and second set of contacts.

According to the invention, the first and second set of contacts of the two sets of connections comprise signal transmission contacts and power contacts.

According to a preferred embodiment of the invention, the cutout is a groove for receiving the conductor made in the thickness of the core and the said groove extends at least between the two rectilinear bores for the reception of contacts.

According to this embodiment, the conductor is a bus bar, a flexible wire, a rectilinear wire mechanically connected to the contacts.

According to another characteristic of the invention, one part of the module contacts is positioned in a bore and is electrically connected to at least one post located on one of the surfaces of the printed circuits, while the other part of the contacts is positioned in a bore and is, or is not, electrically connected to one of the tracks provided on the surface or within the thickness of the printed circuit boards.

According to another embodiment of the invention, the bores of the module mechanically hold the power contacts in place.

According to a first embodiment, the module is integrated into an adapter.

According to a second embodiment, the module is positioned directly on one of the faces of one of the connectors.

Moreover, the embodiments according to the prior art involve a high density of the metallic tracks of printed circuits. This density makes the introduction of components of every type, such as elements of filtration or protection against power surges generated by electromagnetic pulses and electrical discharges and against interference by radio and electromagnetic frequencies, compatible only with difficulty.

According to another embodiment, the invention concerns a module, in which elements of filtration or protection are introduced onto the surfaces of printed circuits of the module.

The invention will be better understood with the help of the following description and the drawings, which are appended to them, in which.

Figure 1:
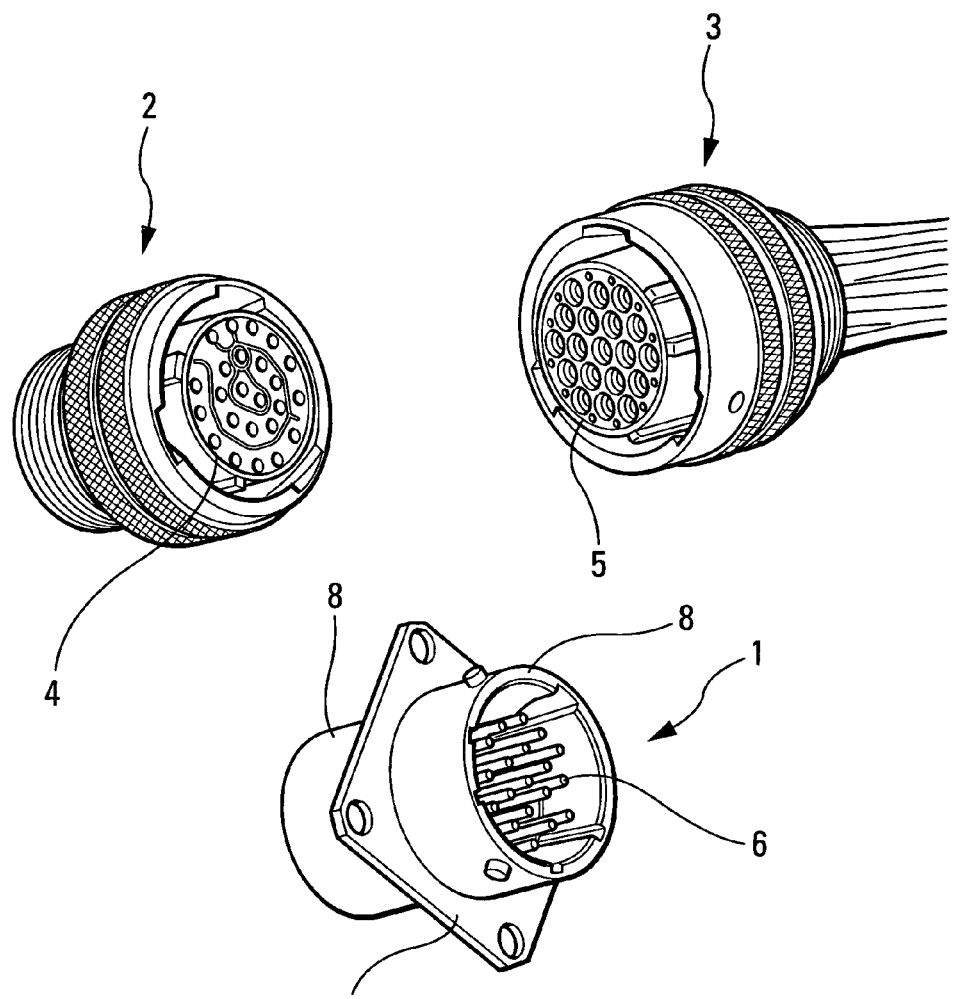
FIG. 1 is a perspective view of connectors to be assembled according to an embodiment of the invention.
Figure 3:
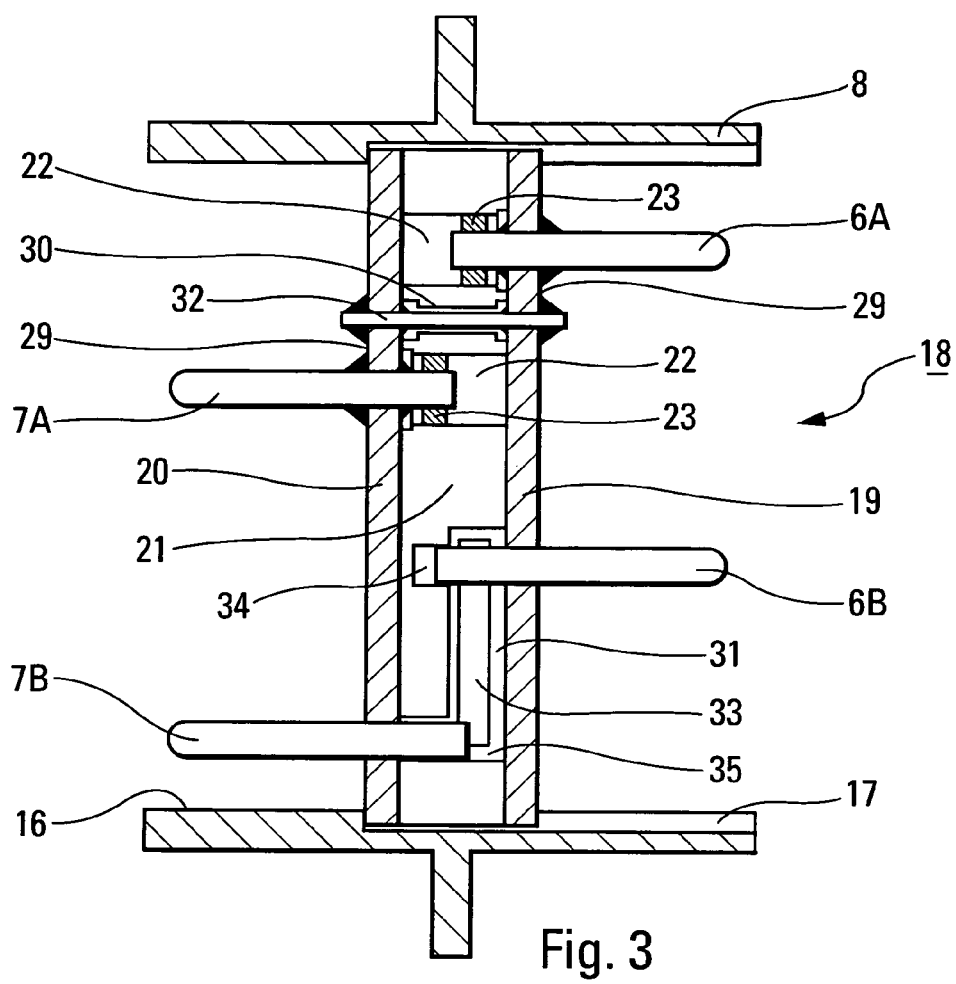
FIG. 3 is a section view of a module according to the invention.

FIG. 1 is an example of an embodiment of an assembly of two sets of connectors with an adapter 1 comprising in its centre a module 18 shown in FIG. 3. These two sets of connections are present in the embodiment in the form of two circular connectors 2 and 3, each comprising a set of contacts 4, 5 of the female type.

The module contained in the adapter 1 is equipped with male contacts 6, 7 shown in FIG. 3, which respectively provide during the assembly, the connection with the female contacts 4, 5 of the connectors 2, 3.

In the embodiment shown, the adapter 1 comprises a circular skirt 8 and a collar 9 located in its centre, which provides its fastening on a rack or cabinet wall, thus making possible, for example, the electrical connection of the two pieces of equipment located on each side of the wall.

Figure 2:
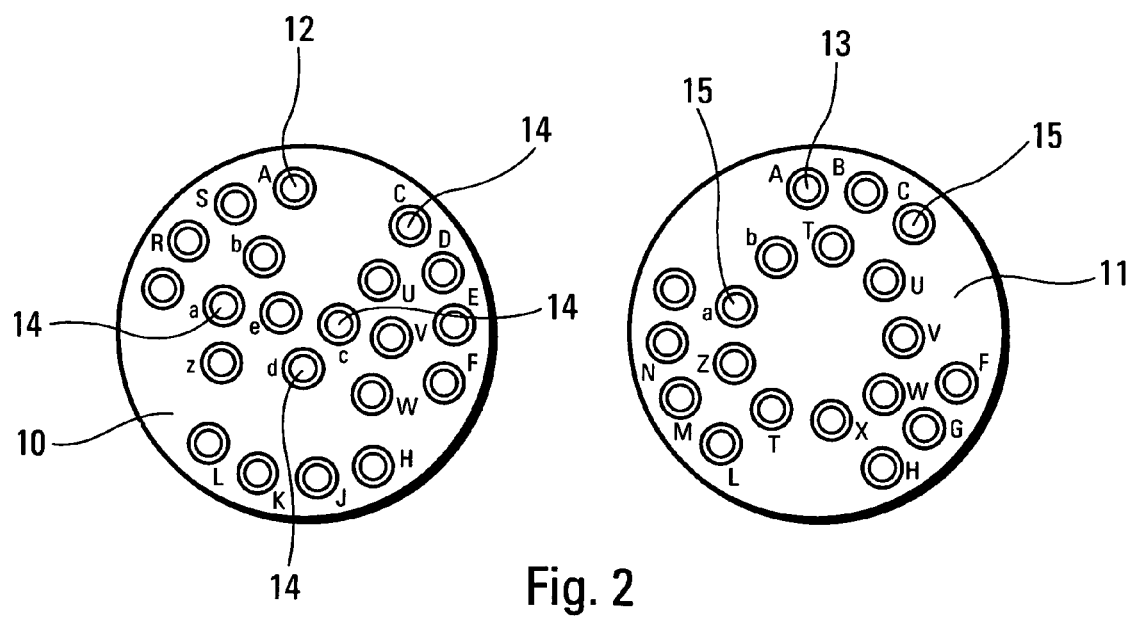
FIG. 2 is an example of the distribution of contacts of the two connectors to be assembled.

In FIG. 2, the front faces 10, 11 of the connectors 2 and 3 show the layout of the contacts of each of them. The face 10 comprises contacts which provide the transmission of either low intensity or earth signals, such as 12A, 12S, 12R, 12b . . . and contacts which provide the transmission of power signals such as 14a, 14d, 14c, 14C . . . .

Similarly, the face 11 comprises contacts which provide the transmission of low intensity or earth signals such as 13A, 13b, 13U . . . contacts 15a and 15C provide the transmission of power signals.

As an example, while contacts 12 and 13 transmit currents of a few mill volts of intensities of a few mill amperes, contacts 14, 15 must in certain cases provide the distribution of currents of 34 amperes under a potential of 28 volts.

FIG. 3 shows a simplified section view of module 18 which equips the adapter 1 shown in FIG. 1. According to this embodiment, the circular skirt 8 comprises on one part of its internal surface 16 a groove 17 for guiding and fastening the module.

The module 18 comprises two printed circuit boards 19, 20. A first set of contacts 6A, 6B is connected to the first printed circuit 19. The contact 6A is electrically connected to at least one of the posts 29 located on the surfaces of the printed circuit board 19 by means of soldering, insertion force or any other conventional means of fastening. The contact 6B is positioned in a through-bore and may, but need not be electrically connected to one of the tracks provided on the surfaces or within the thickness of the printed circuit board 19.

A second set of contacts 7A, 7B is connected to the second printed circuit board 20. The contact 7A is electrically connected to at least one of the posts 29 located on the surfaces of the printed circuit board 20 by means of soldering, insertion force or any other conventional means of fastening. The contact 7B is positioned in a through-bore and may, but need not be electrically connected to one of the plated tracks provided on the surfaces or within the thickness of the printed circuit board 20.

The electrical connection of contacts 6A, 7A and posts 29 can also be made using metal tracks arranged on the surface or within the thickness of the printed circuit boards.

As can be seen in FIG. 3, the contacts of type 6A and 7A are contacts which make possible the transmission of a signal, while contacts 6B and 7B are power contacts. Earth contacts can be positioned in the same way as signal transmission contacts.

The module 18 comprises a central core 21 between the first and the second printed circuit boards 19, 20.

As an example, the total thickness of the module 18 equipped with printed circuits 19, 20 of 4-layer type is between 5 and 6 mm.

Figure 4:
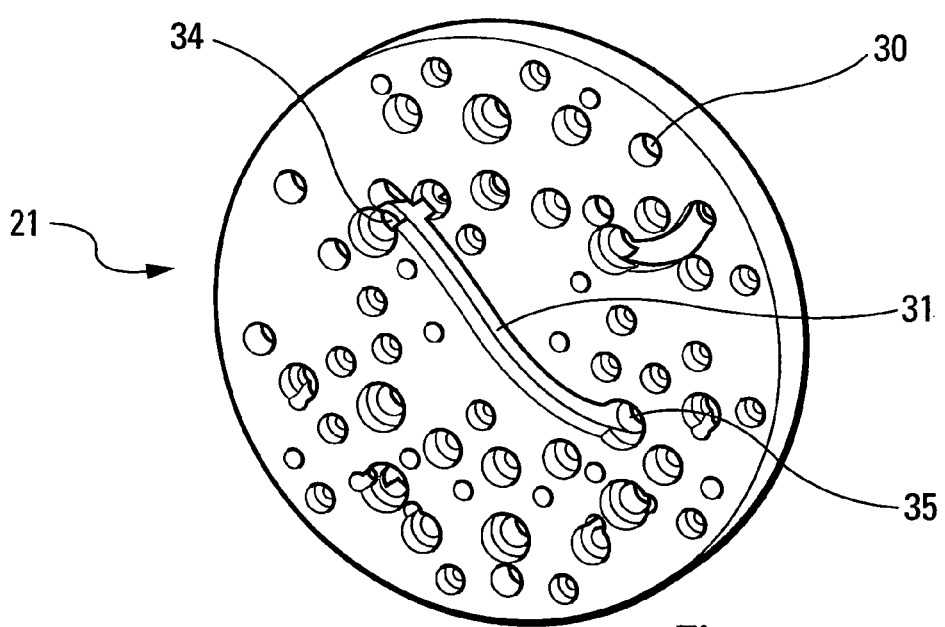
FIG. 4 is an example of an embodiment of a module core according to the invention.

The said central core 21 of insulating material shown in FIGS. 3 and 4 is provided with cutouts 30, 31 for the positioning and holding in place of conductors 32, 33, which respectively provide electrical continuity between contacts 6A, 7A and contacts 6B, 7B of the first and second set of contacts. Conductors 32, 33 could be varnished in order to increase their electrical insulation.

The cutout 30 is a rectilinear through-bore on each side of the core 21 and makes possible the passing through of a rectilinear conductor 32 such as a wire or a pin, which, during the assembly of the module, is soldered at each end to the corresponding posts 29 located in a straight line, one with respect to the other, on each of the printed circuits 19, 20.

In the case of a different arrangement of the posts, plated tracks, which are not shown, provide the electrical continuity of conductor 32.

It should be noted that the bores 22 which receive the ends of contacts 6A, 7A are equipped with rings 23, which provide the positioning and the mechanical holding in place in the core of contacts 6A, 7A.

FIG. 4 is a plan view from above the core 21, in which the cutout 31 is a groove made in the thickness of the core 21. This groove for the reception of conductor 33, which is about 1.5 mm deep, possesses a geometry such that it extends between and makes it possible to connect at least two rectilinear bores 34, 35, which receive contacts 6B, 7B by means of by-passing every bore comprising contacts not involved in the distribution of power signals. These bores have the principal object of mechanically holding in place contacts 6B, 7B. It should be noted that bore 35 is a through-bore, whereas bore 34 is a recessed hole. This latter design makes it possible to avoid any untimely contact with the surfaces of printed circuits 19, 20.

The cutout 31 receives a conductor 33, which moulds itself to the course of the groove and is connected to contacts 6B, 7B. The conductor 33 preferably has the form of a flexible bus bar, whose dimensions are so calculated as to enable it to permit the passage of high-intensity currents under high voltage. The conductor 33 can also consist of a flexible wire, whose design criteria are calculated according to the application.

The fastening of conductor 33 on contacts 6B, 7B is carried out by means of a traditional mechanical means of screwing, crimping, soldering.

The central core 21 shown in FIGS. 3 and 4 is an aluminum part coated with a layer of ceramic oxide in order to harden and densify the said core.

Preferably the KERONITE advanced surface technology process is used in order to provide a completely uniform layer of predictable thickness. For example a thickness of about 150µ is able to cover surfaces of the core 21 including internal surfaces and sharp corners of cutouts 30 and 31. Such a layer provides a high dielectric resistance withstanding voltages in excess of 1000 volts DC.

The central core 21 plated with a KERONITE protection layer makes possible to improve the quality of this part in matter of hardness, wear and heat resistance and corrosion protection.

Figure 5:
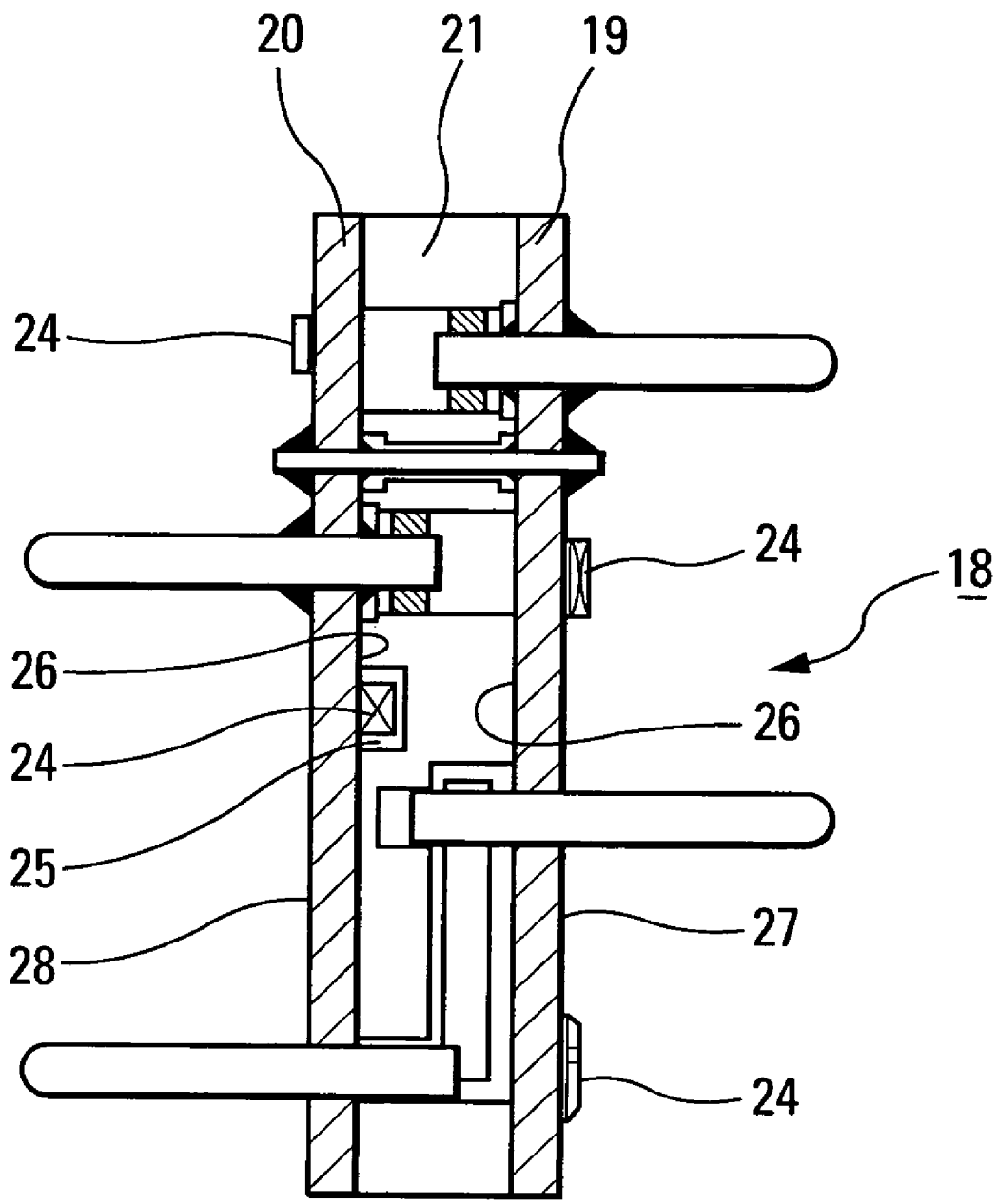
FIG. 5 is a section view of a module according to another embodiment of the invention.

According to an embodiment shown in FIG. 5, the module 18 is not integrated into an adapter 1, but is positioned directly on one of the faces 10 or 11 of the connectors 2 and 3, the housings of the latter then providing the mechanical holding in place of their assembly.

The embodiment in FIG. 5 moreover shows a variant of the invention, in which is provided a filter or a protection function against power surges or excess voltages of the assembly module of the two sets of connectors, or of the sets themselves.

In this embodiment, filtration or protection components 24 against of excess voltages generated by electromagnetic pulses and electrostatic discharges and against radio frequency and electromagnetic interference are introduced on the surfaces 26 of the printed circuit boards. The cavities 25 made in the core 21 receive the components 24. The said cavities 25 make it possible to equip the module with these components, without increasing the total thickness of the module. It is however possible to introduce the components 24 onto the surfaces 27 and 28 of the printed circuit boards.

The invention is not limited to the characteristics of the devices described but, on the contrary, embraces all devices which make it possible to assemble two elements of a connection. It is in this way that the invention concerns any set of connections comprising circular, polygonal and hermaphroditic connectors whether they be cable, card, harness, navel or rack connectors. Similarly, the invention concerns any assembly of connectors equipped with male, male or female, female or male or female contacts. For all these designs, the module is equipped with supplementary contacts, which make assembly possible.

The invention claimed is:

1. A module for the assembly of two sets of connections, which have on their respective coupling faces a set of contacts whose contacts are distributed according to different layouts and densities, the module comprising a first set of contacts connected to a first printed circuit board, a second set of contacts connected to a second printed circuit board, wherein a central core arranged between the first and the second printed circuit board is provided with cutouts for the positioning and holding in place of conductors in order to provide electrical continuity between the contacts of the first and second set of contacts and further wherein the central core is an aluminum part coat with a layer of ceramic oxide.

2. A module according to claim 1, wherein the first and the second set of contacts comprise signal transmission contacts and power contacts.

3. A module according to claim 1, wherein the cutout is a groove for the reception of conductor made in the thickness of the core.

4. A module according to claim 3, wherein the groove extends at least between two rectilinear bores which receive the contacts.

5. A module according to claim 1, wherein the conductor is a bus bar.

6. A module according to claim 1, wherein the conductor is a flexible wire.

7. A module according to claim 1, wherein the conductor is fastened to contacts.

8. A module according to claim 1, wherein the conductor is a rectilinear wire.

9. A module according to claim 1, wherein conductors are varnished.

10. A module according to claim 2, wherein the first contacts are positioned in a bore and are electrically connected to at least one post located y on one of the surfaces of printed circuit boards.

11. A module according to claim 2, wherein the second contacts are positioned in a bore and are electrically connected to a track provided on the surface or within the thickness of the printed circuit boards.

12. A module according to claim 10, wherein contacts are mechanically held in place in the bore.

13. A module according to claim 1, wherein the layer covers internal surfaces and sharp corners of cutouts.

14. A module according to claim 1, wherein the module is integrated into an adapter.

15. A module according to claim 1, wherein the module is positioned directly on one of the faces of the connectors.

16. A module according to claim 1, wherein the components of filtration and of protection against of excess voltages generated by electromagnetic pulses and electrostatic discharges and against radio frequency and electromagnetic interference are introduced onto the surfaces of printed circuit boards.

17. A module according to claim 2, wherein the second contacts are positioned in a bore and are not electrically connected to a track provided on the surface or within the thickness of printed circuit boards.

* * * * *